(12) United States Patent
Arledge et al.

(10) Patent No.: US 6,493,198 B1
(45) Date of Patent: Dec. 10, 2002

(54) ELECTROSTATIC DISCHARGE PROTECTION DEVICE FOR A HIGH DENSITY PRINTED CIRCUIT BOARD

(75) Inventors: John K. Arledge, Fort Lauderdale, FL (US); Jeffrey A. Underwood, Sunrise, FL (US); Joaquin Barreto, Coral Springs, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/507,639

(22) Filed: Feb. 22, 2000

(51) Int. Cl.$^7$ ................................. H02H 9/00
(52) U.S. Cl. ................ 361/56; 361/91.1; 361/111; 361/118
(58) Field of Search ................ 361/212, 56, 112, 361/220, 91.1, 111, 118, 119, 127, 129

(56) References Cited

U.S. PATENT DOCUMENTS

| | | | |
|---|---|---|---|
| 4,160,210 A | | 7/1979 | Molinari ................ 325/362 |
| 5,164,880 A | * | 11/1992 | Cronin ................ 361/220 |
| 5,220,489 A | * | 6/1993 | Barreto et al. ........ 361/783 |
| 5,315,472 A | | 5/1994 | Fong et al. ............ 361/212 |
| 5,357,397 A | * | 10/1994 | Leary ................ 361/220 |
| 5,828,555 A | * | 10/1998 | Itoh ................ 361/784 |
| 5,933,307 A | * | 8/1999 | West ................ 361/56 |
| 5,963,415 A | * | 10/1999 | Johansen ............ 361/212 |

* cited by examiner

Primary Examiner—Stephen W. Jackson
(74) Attorney, Agent, or Firm—Dale W. Dorinski; Daniel C. Crilly

(57) ABSTRACT

An electrostatic discharge protection device for a high-density printed circuit board consists of a layered structure starting at the bottom layer with a ground conductor. A dielectric layer covers the ground conductor to electrically isolate it from a circuit trace that is on top of the dielectric layer. A via is formed in the dielectric layer such that a portion of the ground conductor is exposed, and the via is strategically located such that the edge of the via is tangent to an edge portion of the circuit trace. The via forms a spark gap between the edge portion of the circuit trace and the underlying ground conductor, using air as the dielectric medium.

6 Claims, 1 Drawing Sheet

ELECTROSTATIC DISCHARGE PROTECTION DEVICE FOR A HIGH DENSITY PRINTED CIRCUIT BOARD

TECHNICAL FIELD

This invention relates in general to electrostatic discharge protection for electronic circuits, and more particularly to a non-moving electrostatic discharge structure that is readily integrated into the product being protected.

BACKGROUND

Electronic components that are sensitive to electrostatic discharge (ESD) are utilized in a wide range of products including computers, two-way radios and cellular telephones. A common cause of electrostatic discharge is the physical contact or handling by a person of a product containing ESD sensitive electronic components, as in the course of replacing an inkjet print cartridge or a rechargeable battery, for example. In particular, electrostatic charge that may have been accumulated by a person will be discharged upon physical handling of the product. The path of discharge in the product will be the path of least impedance from the location of charge transfer and may include ESD sensitive electronic components. Known techniques for preventing damage as a result of ESD include the integration of protection circuitry into electronic components, anti-static packaging, shielding covers to prevent contact with conductive elements, and static charge dissipating furnishings such as anti-static rugs and table mats. Considerations with integrating protection circuitry into electronic components include difficulty in achieving the requisite level of protection, and the burden of re-designing existing electronic components, particularly those that include integrated circuits. U.S. Pat. No. 4,160,210 attempted to partially solve the problem of ESD by fabricating a serpentine conductor on a printed circuit board (PCB), then mounting the PCB on a grounded metal chassis of the receiver's tuner so that the serpentine conductor and the grounded chassis form a transmission line for matching the impedances of the receiver's antenna network and tuner circuitry. Eyelets that connect the serpentine conductor to the antenna network and tuner circuitry extend through the dielectric material of the printed circuit into cutout areas in the chassis. Tabs extend from the peripheries of the cutout areas toward the eyelets to form spark gaps for discharging excessively high energies which may be induced by lightning.

However, anti-static packaging and shielding covers add cost, and moreover cease to afford ESD protection after removal. The use of static dissipating furnishings can be burdensome and therefore not readily implemented, and moreover may not provide sufficient ESD protection. Adding eyelets and associated connectors to a chassis consumes a great deal of space, and is not a workable solution for today's compact, high density circuitry.

DETAILED DESCRIPTION OF THE PREFERRED EMBODIMENT

An electrostatic discharge protection device for a high density printed circuit board consists of a layered structure, starting at the bottom layer with a ground conductor. A dielectric layer covers the ground conductor to electrically isolate it from a circuit trace that is on top of the dielectric layer. A via is formed in the dielectric layer such that a portion of the ground conductor is exposed, and the via is strategically located such that the edge of the via is tangent to an edge portion of the circuit trace. The via forms a spark gap between the edge portion of the circuit trace and the underlying ground conductor, using air as the dielectric medium. The present invention provides a significant improvement over other prior art spark gaps by taking advantage of high density interconnect (HDI) PCB technology to make the gap smaller and allowing the structure to bleed off lower ESD voltages. The novel design consumes less space and does not require that the ground conductor be located on the same plane or layer as the circuit being protected.

Figure 1:
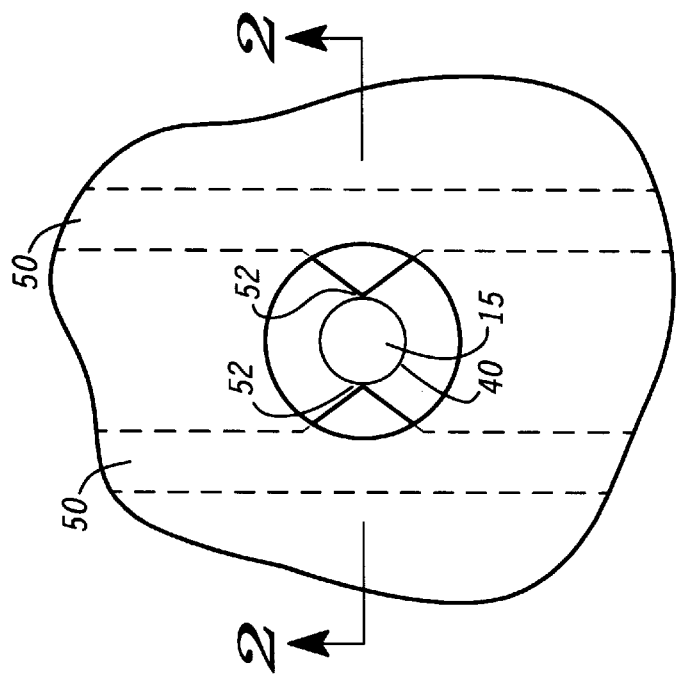
FIG. 1 is a plan view of a spark gap depicting a conductive ground exposed to a metallization pattern located above and adjacent to the edge of a via in accordance with the invention.
Figure 2:
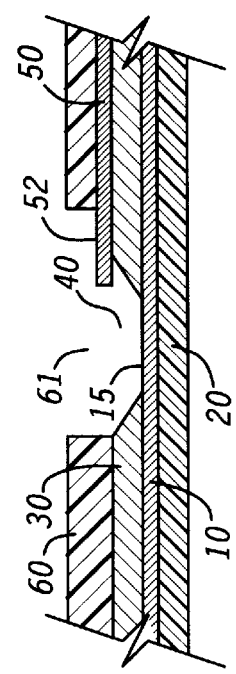
FIG. 2 is a cross sectional view of FIG. 1 through section 2—2, in accordance with the invention.

While the specification concludes with claims defining the features of the invention that are regarded as novel, it is believed that the invention will be better understood from a consideration of the following description in conjunction with the drawing figures, in which like reference numerals are carried forward. As will be discussed in detail below, the present invention utilizes a new and novel application of mass manufacturing technologies, particularly high density interconnect (HDI) microvia technology and fine line technology. Referring now to FIGS. 1 and 2, in the preferred embodiment of the invention a ground conductor or ground plane 10 is disposed on a dielectric substrate 20. The dielectric substrate is typically a glass reinforced printed circuit board such as FR-4 or polyimide, but other PCB constructions will find usage, as well as other types of dielectric substrates such as ceramic or "flex" circuit that generally comprises a flexible planar film. The ground conductor 10 can be a ground plane that covers a large amount of the surface of the substrate, or it can simply be a line that is connected to ground, but it need not be a ground plane. A thin layer of dielectric material 30 covers the ground conductor 10 and any exposed portions of the substrate 20. An aperture or via 40 is formed in the dielectric layer 30 so that a portion 15 of the ground conductor 10 is exposed by etching, for example, portions of the dielectric layer using HDI microvia photolithographic techniques. Although depicted in the drawing figures as a circular opening, the via 40 can be elongated, square, or any other desired shape. One or more circuit conductors generally indicated by the reference numeral 50 are disposed on top of the layer of dielectric material 30. The circuit conductors 50 are elongated conductive traces typically used to carry the various signals of the electronic device, and in the case of an HDI circuit there are a large number of circuit traces spaced very close together. For purposes of illustration only some of the circuit traces are shown. One or more of the circuit traces 50 is arranged such that a portion 52 of the trace is disposed near the via 40 to create a spark gap that provides for discharge paths between the circuit trace and the ESD conductive grounding pattern. The portion 52 that is disposed near the via 40 is preferably tangential to the perimeter of the via, however, owing to various misregistration errors that can occur in the fabrication of a PCB, there will be situations in which the tangential portion 52 is not exactly tangential to the perimeter of the via, but is substantially tangential. That is, misregistration error can cause it to be as much as 2 millimeters away from the perimeter, and still fall within the metes and bounds of our claimed invention. Of course, as the distance of the tangential portion 52 from the via 40 increases, the effectiveness of the electrostatic discharge mechanism decreases, so it is desirable to place it as close as possible to the edge. In the preferred embodiment, the portion 52 of the circuit trace 50 protrudes out from the edge of the trace as shown in FIG. 1. The preferred shape of the protrusion 52 is triangular, in order to focus or concentrate the electrostatic discharge, but other shapes can of course be used, such as an arcuate end, an orthogonal end or a polygonal end. It should be appreciated that other spark gap configurations can be utilized to provide a gap between narrow conductive tabs which provide a relatively low impedance discharge path for electrostatic energy. The intent is to provide field concentrating regions that have a field breakdown voltage that is significantly less than the breakdown voltage between adjacent conductive elements forming the interconnect lines and pads; i.e., the spark gaps are configured such that the voltage required to produce a spark in a spark gap is less than the voltage required to produce a spark between adjacent conductive interconnect elements.

The foregoing ESD protection structure generally functions by providing an effective discharge path from one or more selected points 52 on the circuit trace 50 to an underlying ground 10 that has been exposed 15 by apertures 40 in the dielectric layer. The spark gaps prevent the potential differences between adjacent interconnects from exceeding a defined limit range known to be safe for the circuitry interconnected by the interconnect circuitry and generally determined by the gap size. For example, if a person carrying an electrostatic charge touches an interconnect pad of an ungrounded accessory, the resulting discharge will travel through the relatively lower impedance presented by the spark gap or gaps to the ground metallization pattern and to the substrate ground so as to maintain the potential differences at less that the defined limit range. In other words, the ESD protection circuit encourages electrostatic discharge to take predetermined paths that limit the potential differences between interconnect lines. The ground conductor provides a discharge path of electrostatic charge that may be stored in the interconnect circuitry and the interconnected elements, or electrostatic charge that is discharged by a person using the electronic device.

Figure 3:
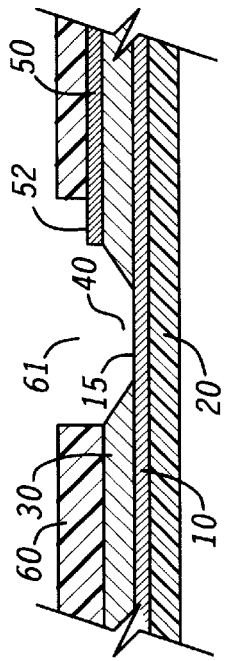
FIG. 3 is a plan view of an alternate embodiment of the invention.

FIG. 1 shows two spark gaps located directly across from each other, but the invention is not limited to this configuration. A single spark gap extending from a single conductor to an underlying ground connection can, of course, be used. FIG. 3 shows an alternate embodiment of the invention where the tangential portion 52 of the circuit trace actually overhangs the edge of the microvia 40. This arrangement also provides a controlled electrostatic discharge by forming a spark gap between the point of the overhanging circuit trace and the ground conductor below. As long as the circuit trace 50 and the ground conductor 20 are electrically isolated, the spark gap will function as intended. In addition, a layer of solder mask 60 can optionally be applied over the circuit trace and the HDI dielectric, however care should be taken to insure that an opening 61 is formed in the solder mask directly above the via 40. The two apertures 61, 40 are preferably co-axial to insure that air is present in the spark gap.

The foregoing has been a disclosure of an ESD protection structure that is integrated into the layout of the PCB. The ESD protection structure has no moving or removable parts, encompasses less surface area than conventional spark gap layouts, and moreover aids in providing ESD protection during the manufacture of the product in which it is incorporated. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the following claims.

What is claimed is:

1. An electrostatic discharge protection device for a high density printed circuit board, comprising:

a printed circuit board having a ground conductor disposed on a first major side;

a dielectric layer covering the ground conductor;

a circuit trace defined on the dielectric layer, said circuit trace electrically isolated from said ground conductor;

a via formed in the dielectric layer such that a portion of the ground conductor is revealed, said via located at least substantially tangent to a portion of the circuit trace, such that said via forms a spark gap between said portion of the circuit trace and the ground conductor, having air as a dielectric medium.

2. The electrostatic discharge protection device for a high density printed circuit board as described in claim 1, wherein said portion of the circuit trace overhangs the via.

3. The electrostatic discharge protection device for a high density printed circuit board as described in claim 1, wherein said portion of the circuit trace is a protrusion or a tab.

4. The electrostatic discharge protection device for a high density printed circuit board as described in claim 1, wherein the tab has a pointed end, an arcuate end, an orthogonal end or a polygonal end.

5. The electrostatic discharge protection device for a high density printed circuit board as described in claim 1, further comprising a solder mask layer disposed over the circuit trace and the dielectric layer, said solder mask layer having an opening directly overlying said via.

6. An electrostatic discharge protection structure formed on an interconnect circuit substrate, comprising:

a printed circuit board having a circuit trace disposed on a first major side;

a dielectric layer covering the circuit trace;

a ground conductor defined on the dielectric layer, said ground conductor electrically isolated from said circuit trace;

a via formed in the dielectric layer such that a portion of the circuit trace is revealed, said via located at least substantially tangent to a portion of the ground conductor, such that said via forms a spark gap between said portion of the circuit trace and said portion of the ground conductor, having air as a dielectric medium.

\* \* \* \* \*